United States Patent [19]

Janesick

[11] Patent Number: 4,963,952
[45] Date of Patent: Oct. 16, 1990

[54] MULTIPINNED PHASE CHARGE-COUPLED DEVICE

[75] Inventor: James R. Janesick, La Canada, Calif.

[73] Assignee: California Institute of Technology, Pasadena, Calif.

[21] Appl. No.: 321,739

[22] Filed: Mar. 10, 1989

[51] Int. Cl.$^5$ .................... H01L 29/78; H01L 27/14; H01L 31/00
[52] U.S. Cl. ........................................ 357/24; 357/30
[58] Field of Search .................. 357/24, 30; 377/57–63

[56] References Cited

U.S. PATENT DOCUMENTS

| | | | |
|---|---|---|---|
| 3,931,465 | 1/1976 | Levine | 357/24 LR |
| 4,328,432 | 5/1982 | Yamazaki | 357/24 LR |
| 4,663,771 | 5/1987 | Takeshita et al. | 357/24 LR |
| 4,742,381 | 5/1988 | Fujii | 357/24 LR |
| 4,760,031 | 7/1988 | Janesick | 437/3 |
| 4,798,958 | 1/1989 | Janesick et al. | 357/24 LR |
| 4,822,748 | 4/1989 | Janesick et al. | 357/24 LR |

OTHER PUBLICATIONS

Janesick et al. "Radiation Damage in Scientific Charge-Coupled Devices", IEEE Trans. Nuclear Science, vol. 36(2/89) pp. 572–578, Which is Proceedings Nuclear Science Symposium, Orlando, Nov. 9–11, 1988.
Janesick et al. "Fano-Noise-Limited CCDS", Proceedings SPIE vol. 982, X-Ray Instrumentation in Astronomy, pp. 70–94, San Diego, 15–17 Aug. 1988.
Janesick et al. "Recent Developments in Large Area Scientific CCD Image Sensors", Spie Optical Sensonrs and Electronics Photography Conf., Los Angeles, Jan. 16–18, 1989.
J. Janesick, et al., "Backside Charging of the CCD", Solid State Imaging Arrays, K. Prettyjohns and E. Dereniak, eds. Proc. Spie 570, p. 46–80, 1985.
J. Janesick, et al., "The CCD Flash Gate", Instrumentation in Astronomy VI, D. Crawford, ed. Proc. Spie 627, pp. 543–582, 1986.
J. Janesick, et al., "Charge-Coupled Device Charge Collection Efficiency and the Photon Transfer Technique", Opt. Eng. 26(10), pp. 972–980, Oct. 1987.
J. Janesick, et al., "Charge-Coupled Device Advances for X-Ray Scientific Applications in 1986," Opt. Eng. 26(2), pp. 156–166, Feb. 1987.
R. Walden, et al., "The Buried Channel Charge Coupled Device", Bell System Technical Journal, vol. 51, pp. 1635–1640, 1972.
J. Janesick, et al., "Fano-Noise-Limited CCDs", Spie Optical and Optoelectronic Applied Science and Engineering Symposium, X-ray Instrumentation in Astronomy, San Diego, Aug. 14–19, 1988.
M. Blouke, et al., "Current Status of the 800X800 Charge-Coupled-Device Image Sensor", Opt. Eng. 26(9), pp. 864–874, Sept. 1987.
J. Janesick, et al., "Scientific Charge-Coupled Devices", Opt. Eng. 26(8), pp. 692–714, Aug. 1987.

*Primary Examiner*—Gene M. Munson
*Attorney, Agent, or Firm*—Antonio M. Fernandez

[57] ABSTRACT

A back illuminated, buried channel, multiphase charge-coupled device for imaging has a photosensitive volume bounded by silicon dioxide layers on both the front and back. The dark noise generated by these interfaces with the photosensitive volume is reduced by negative bias potential pinning the front at about −6V and the back at about −0.4V. To create fixed barrier phases at the front for accumulation within each pixel comprised of multiphase gates, positive ions are implanted at one phase gate while the others are phase clocked into channel inversion. Otherwise the phase clock of at least one gate must be controlled to provide accumulation to provide a "partial-inversion" technique. The negative bias at the back may be varied to adjust the quantum efficiency of the device, thus providing electronic shuttering.

7 Claims, 9 Drawing Sheets

MPP Timing Diagram

MULTIPINNED PHASE CHARGE-COUPLED DEVICE

ORIGIN OF THE INVENTION

The invention described herein was made in the performance of work under a NASA contract, and is subject to the provisions of Public Law 96-517 (35 USC 202) in which the Contractor has elected to retain title.

TECHNICAL FIELD

This invention relates to multiphase charge-coupled devices (CCD) and more particularly to elimination of dark current at the front and back Si—SiO$_2$ interfaces of an overthinned back-illuminated CCD.

BACKGROUND ART

A continuing effort has been made to reduce read noise of charge-coupled devices below the one electron r.m.s. level. However, self-generation of charge internal to the sensor becomes critically important in this effort. During the development of charge-coupled devices, at least a dozen different sources have been identified, for example spurious charge, luminescent amplifiers, etc. All of these generate unwanted charge and accompanying shot noise within a CCD array. One particularly important source is generation of dark current at the Si—SO$_2$ interfaces, such as that which bounds a back-illuminated CCD. Surprisingly, numerous performance parameters for the back-illuminated buried-channel CCD are intimately dependent on the oxide surfaces that bound the sensor's photosensitive volume. Imperfections at the silicon-silicon dioxide interface can significantly influence CCD performance in areas of quantum efficiency, charge collection efficiency, charge transfer efficiency, read noise, full well capacity, dark current generation, pixel nonuniformity, residual image and high energy radiation damage effects. Although CCD manufacturers strive to fabricate the finest oxide interfaces possible for the CCDs, the resultant interfaces are still far from perfect. Imperfections at the silicon-silicon dioxide interface result in surface states which interact with photogenerated carriers and the generation of unwanted spurious signals, such as dark current and residual charge. It would be desirable to passivate and eliminate front and back silicon-silicon dioxide interfaces with free mobile holes.

STATEMENT OF THE INVENTION

In accordance with the present invention, the silicon-silicon dioxide interfaces of a back-illuminated CCD are passivated by biasing the Si—SiO$_2$ interfaces in the front and back. On the front multiphase-gate side, biasing and pinning the phase-clocked array gates into inversion (hence the term "multipinned-phase") causes holes to populate at the interface, thus eliminating surface dark current generation. However, to avoid adverse effects in full well capacity, implanting p dopants in the areas confined beneath one or more of the phase-clocked gates is necessary, thus providing a potential difference between the phased gates to allow charge to gather in collecting sites free of extra dopant while maintaining the inverted condition, and thereafter transferring the charges from well to well during readout. On the backside of the CCD, the Si—SO$_2$ interface is passivated by negative biasing a metal flash gate to heavily populate the interface with holes. This eliminates backside dark current and directs photogenerated carriers away from the back to the front where they are collected in wells and then transferred out under control of multiphased clocks. An additional advantage of negative biasing on the metal flash gate is that the bias may be used as a shutter to control the rate of exposure.

The novel features that are considered characteristic of this invention are set forth with particularity in the appended claims. The invention will best be understood from the following description when read in connection with the accompanying drawings.

DETAILED DESCRIPTION OF THE INVENTION

Figure 1:
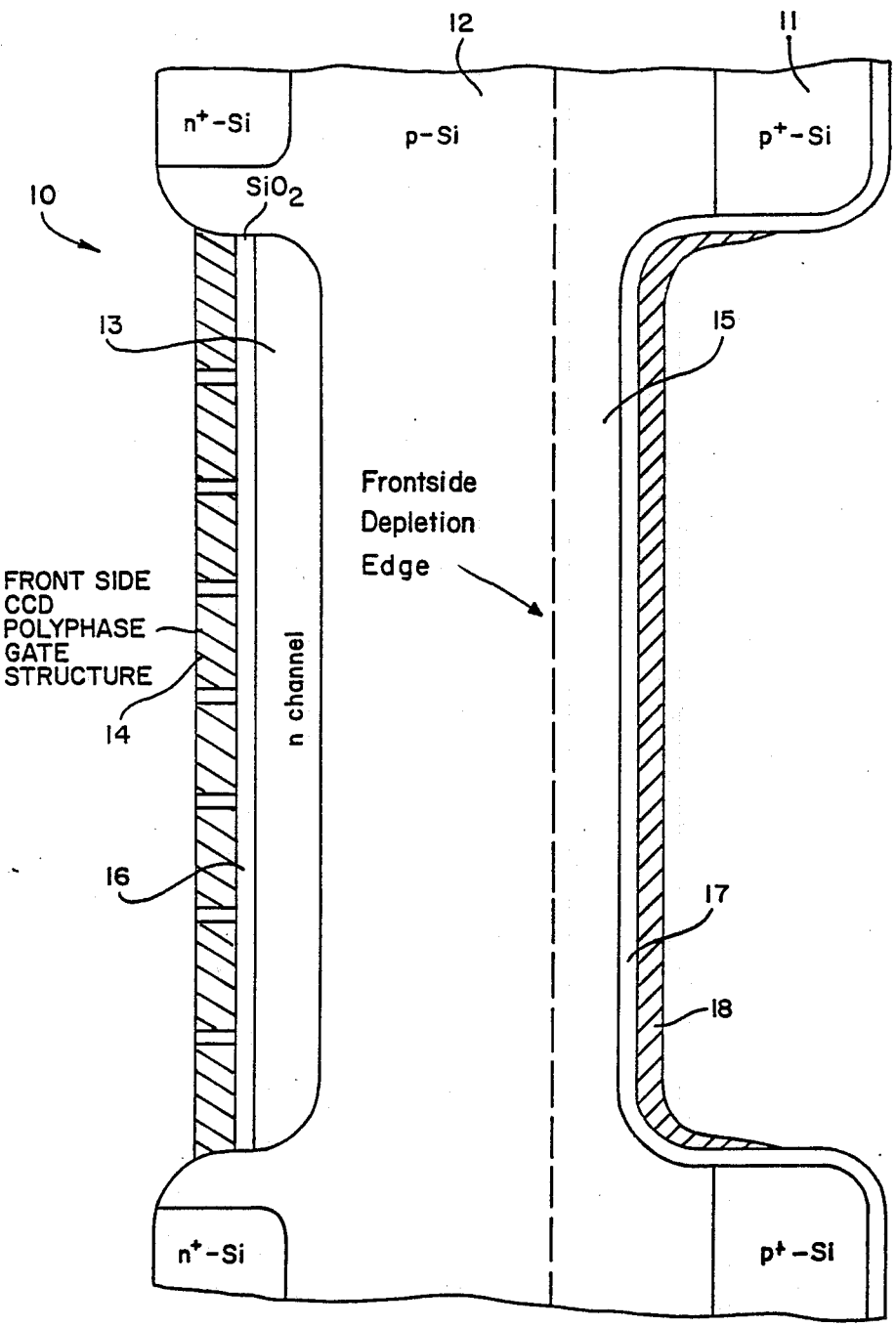
FIG. 1 illustrates schematically a cross section of a prior-art thinned, back-illuminated silicon CCD with a metal flash gate over the thinned area in which two aspects of the present invention may be practiced to enhance sensitivity of the CCD.

Referring first to the prior art illustrated in FIG. 1, a back-illuminated CCD imaging sensor 10 is improved as described in the U.S. Pat. No. 4,760,031 by so overthinning the backside of a p+-doped substrate 11 to a level significantly into an epitaxially grown p-Si layer 12, and a buried n channel 13 diffused into the epitaxial layer 12, and over which a gate structure 14 is fabricated to complete the frontside of the CCD imaging sensor. Although this gate structure may take any of the forms known to those skilled in the art, one aspect of the present invention is best practiced with a three- or four-phase gate structure, as will be described below.

The backside of the CCD sensor, which is to be illuminated by an image, is overthinned to produce a membrane 15 in the p-Si layer under the n channel 13. Additional details of this CCD imaging sensor is as described in the aforesaid patent. What is important about the structure is that a thin SiO2 film 16 about (1000 Å) separates the CCD gate structure 14 from the n channel 13 and a thin film 17 of flash oxide (30 Å) separates a flashed backside metal film 18 (sometimes referred to hereinafter as a "metal flash gate").

Surprisingly, numerous performance parameters for the back-illuminated buried-channel CCD are intimately dependent on the oxide surfaces that bound the sensor's photosensitive volume between the metal flash gate 18 and the CCD gate structure 14. Imperfections at the silicon-silicon dioxide interfaces can significantly influence CCD performance in areas of quantum efficiency, charge collection efficiency, charge transfer efficiency, read noise, full well capacity, dark current generation, pixel nonuniformity, residual image and high energy radiation damage effects. Although manufacturers strive to fabricate the finest oxide interfaces possible for their CCDs, those interfaces are still far from perfect. Imperfections at the silicon-silicon dioxide interfaces result in surface states which interact with photogenerated carriers and the generation of unwanted spurious signals such as dark current and residual charge.

Investigation of this back-accumulation problem of the CCD has had a long and interesting past starting soon after the CCD was invented A portion of the accumulation story is discussed in J. Janesick, et al., "Backside Charging of the CCD," Solid State Imaging Arrays, K. Prettyjohns and E. Dereniak, Eds., Proc. SPIE 570, pp. 46–80, 1985; J. Janesick, et al., "Flash Technology for Charge-Coupled Device Imaging in the Ultraviolet," Optical Engineering, 26(9), pp. 852–863, September 1987; J. Janesick, et al., "The CCD Flash Gate, Instrumentation in Astronomy VI", D. Crawford, Ed., Proc. SPIE 627, pp. 543–582, 1986; and J. Janesick, et al., "Quantum Efficiency Model for the CCD Flash Gate," IEEE Int. Electron Devices Meeting, 86CH2381-2, pp. 350 352, 1986. Accumulation, although simple in theory, has proved to be difficult to implement. Literally millions of dollars have been invested by the CCD manufacturers to develop a process to control the CCD's back surface potential to eliminate backside dark current and to direct photogenerated carriers away from the back to the front pixel sites. The objective today is clearer than it has been in the past, specifically to develop an accumulation process that drives the CCD into the QE-pinned state, an optimum condition that achieves the highest QE possible for the back-illuminated CCD. The QE-pinned condition delivers 100% internal QE and signifies that all photogenerated charge is collected in the front pixel wells. When a CCD is QE-pinned, losses are caused only by reflection or transmission effects; there are no internal losses.

QE-pinning is currently being achieved by using backside charging and flash gate techniques on TI, Ford, Tektronix and Reticon back-illuminated CCDs. See Janesick, et al., "Backside Charging of the CCD," and Janesick, et al., "The CCD Flash Gate," cited above. Both methods induce negative charge on the back surface of the CCD generating a voltage of a few tenths of a volt. The voltage, although seemingly small, induces a thin but very concentrated layer of holes at the Si—SiO2 interface. The hole gradient produced creates a strong electric field (greater than $2 \times 10^5$ V/cm$^2$ for some CCD types) which sweeps all photogenerated charge away from the back of the sensor. Numerous CCD devices now use these accumulation methods to achieve optimum QE performance, especially in the UV where QE-pinning is essential for reasonable sensitivity.

Unfortunately backside charging and the flash gate described in Janesick, et al., "Backside Charging of the CCD," and Janesick, et al., "The CCD Flash Gate," cited above, do not provide the pinned state under all possible environmental conditions. For example, when backside charging is utilized the CCD must be kept cold ($< -50°$ C.) or the backside charge will dissipate. For most scientific applications, where cold operation is necessary in any event to reduce dark current generation, backside charging has proved to be a satisfactory method to obtain optimum QE performance. However, for warm applications the technique may not be practical since the back surface must be continually recharged to maintain a QE-pinned state.

The flash gate technique is a more permanent solution to the accumulation problem since QE-pinning can be maintained indefinitely under warm conditions. However, as will be described below, when the flash gate is used under warm high-vacuum situations, the pinning effect is lost. In spite of this problem, the flash gate is still useful under cold high-vacuum environments.

The photosensitive volume of a thinned back-illuminated CCD is bounded on the front by oxide layer 16 and on the back by the thin oxide film 17. The front-oxide is thermally grown early in the fabrication of the CCD ranging in thickness between 500 and 1200 Å. After the CCD is thinned, the back-oxide either forms naturally (i.e., native oxide) or is intentionally grown by a low temperature ($< 300°$ C.) steam process (i.e., flash oxide). The back-oxide thickness is extremely thin, typically limited to less than 50 Å. The front and back Si-Si-2 interfaces associated with the oxide layers do not grow perfectly because a lattice mismatch may occur between silicon atoms and the oxide molecules during the growth process. These imperfections result in "dangling bonds" at each interface creating what are referred to as interface states or surface states. The density of surface states is very dependent on the orientation of the silicon substrate and the process used in growing the oxide. For example, the front oxide layer 16 is grown by a high temperature process producing a low-surface state density of $10^9$–$10^{10}$ states/cm$^2$. The back oxide film 17 is an inferior oxide since high temperature processes cannot be tolerated after the CCD is thinned. Consequently, the surface state density is much higher in the oxide film 17, ranging from $10^{11}$–$10^{13}$ states/cm$^2$.

Although the Si—SiO$_2$ interfaces occupy an exceedingly small region (<20 Å) of the CCD, their electronic properties can have a profound effect on the overall performance of the sensor. For example, a thinned CCD will exhibit very poor quantum efficiency (QE) due to a fixed positive charge associated with the surface states. The charge depletes the p-silicon at the back of the CCD forming what is referred to as a "backside-well." The well collects a photogenerated charge forcing it to the back of the sensor where it recombines at the Si—SiO$_2$ interface. A thinned CCD with a poorly formed back-oxide layer 17 and high surface state density typically exhibits backside-well depths of greater than 2-microns yielding a peak QE in the visible wavelength of less than 20% (considerably less sensitivity than what can be achieved by a thick front-illuminated CCD). Furthermore, a signal charge reaching the back of the CCD interplays with the interface states through a trapping and detrapping process. The consequence of charge trapping at the back of the CCD causes the depth of the backside-well to vary in size resulting in unstable QE performance. This high undesirable trait is referred to as "quantum efficiency hysteresis (QEH)" and has plagued the back-illuminated CCD described in the aforesaid patent since its inception.

The backside-well also has a profound effect on the charge-collection efficiency (CCE) performance of the CCD. See J. Janesick, K. Klaasen and T. Elliott, "Charge-Coupled Device Charge Collection Efficiency and the Photon Transfer Technique," Opt. Eng. 26(10), pp. 972–980, October 1987. For example, in soft x-ray imaging spectrometer applications, the presence of a backside-well significantly degrades the energy resolution capability of the CCD. For these applications, it is critically important that the charge generated by an x-ray event be totally collected at a pixel site so the energy of the photon can be assessed. However, the presence of a backside-well will cause the charge packet of an x-ray event to split between the front and back surfaces producing a large population of "partial x-ray events," events which disturb the measurement of photon energy. See J. Janesick, T. Elliott, S. Collins, T. Daud, D. Campbell and G. Garmire, "Charge-Coupled Device Advances for X-ray Scientific Applications in 1986," Opt. Eng. 26(2), pp. 156–166, February 1987.

The front Si—SiO$_2$ interface also influences the performance of the CCD in many ways. When the "buried-channel" CCD was first introduced, it was believed that the signal charge was removed far enough from the interface to where its influence would not be detectable. See R. Walden, et al., "A Buried Channel Charge-Coupled Device," Bell Syst. Tech. J., Vol. 51, PP. 1635–1640, 1972. The idea dramatically improved charge transfer efficiency (CTE) characteristics for the CCD allowing signal charge to be moved in the bulk silicon as opposed to transferring through interface states. CTEs greater than 0.999999 are now routinely achieved for scientific applications because of the buried-channel concept. See J. Janesick, et al., "Fano-Noise Limited CCDs," SPIE Optical and Optoelectronic Applied Science and Engineering Systems, X-Ray Instrumentation in Astronomy, San Diego, Aug. 14–19, 1988. Although most scientific CCDs are now buried-channel, the Si—SiO$_2$ interface problem remains to influence many important CCD performance parameters. For example, dark current generation in CCDs is directly proportional to the density of interface states found at the front Si—SiO$_2$ interface. Other CCD parameters related to the front surface include surface residual image properties, pixel nonuniformity, 1/f amplifier noise, CCD traps and CTE, full well capacity and high energy ionizing radiation effects.

Figure 2:
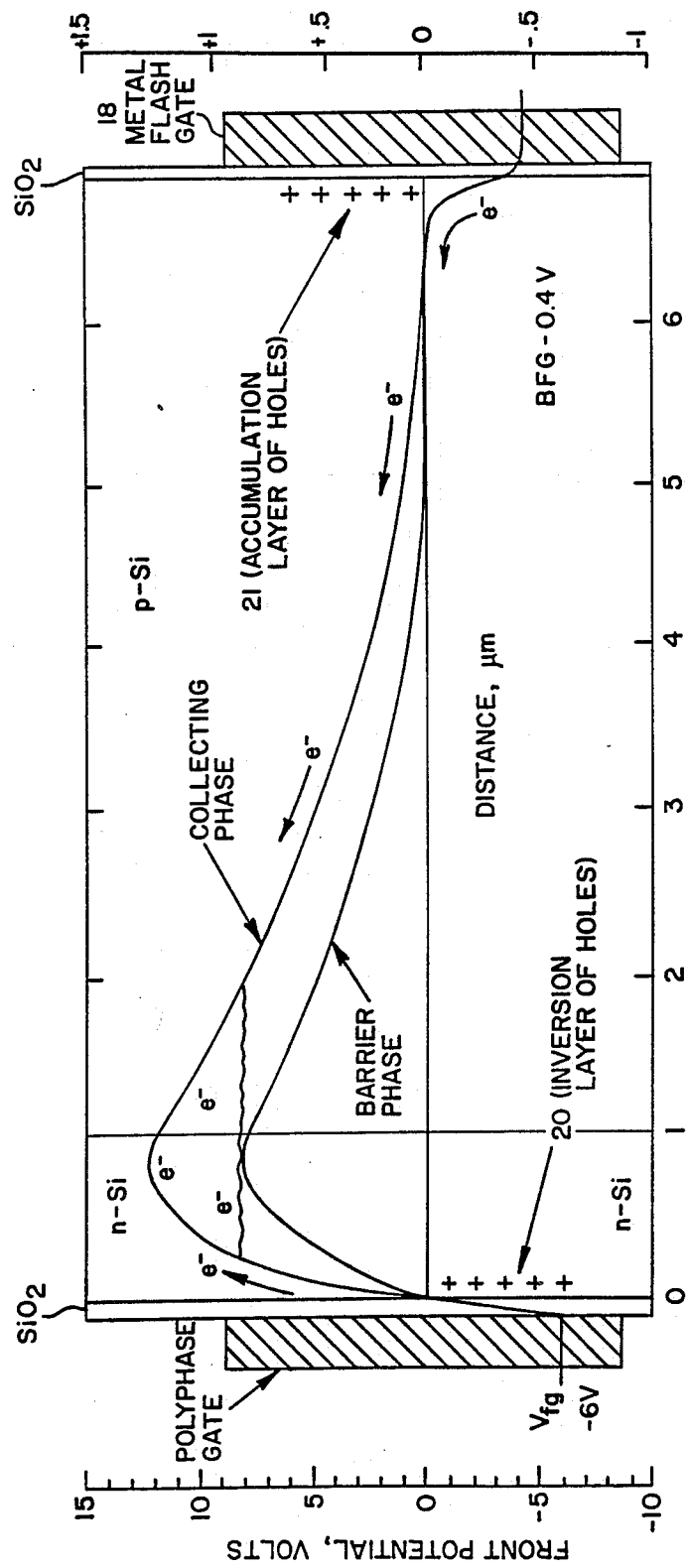
FIG. 2 illustrates an ideal potential profile through the thinned, back-illuminated CCD of FIG. 1 in which front and back interfaces between silicon and silicon dioxide layers are "pinned" with mobile holes in accordance with both aspects of the present invention.

The present invention provides technology for controlling the front and back Si—SiO$_2$ interfaces to reduce, and in some cases eliminate, those problems mentioned above. There are two parts to the present invention: (1) a front inversion method, applicable to the front surface of the CCD, and (2) a back-accumulation method that controls the sensor's back surface potential. In each part, the object is to "pin" the Si—SiO$_2$ interface surface potential by heavily populating the interface with holes. The hole concentration thus produced passivates the interface states and creates an electric field which directs signal charge away from the interface towards the buried n channel 13. When both parts are employed, the photosensitive volume of the CCD becomes sandwiched between a layers of holes as illustrated in FIG. 2 which illustrates an ideal potential profile between one of a plurality of frontside multiphase gates of the CCD gate structure 14 and backside flash gate 18, where the Si—SiO$_2$ interfaces are "pinned" with a bias voltage applied to the gates. The front surface is "inverted" by multipinned-phase (MPP) operation, whereas the back surface is "accumulated" by a fixed bias applied to the biased flash gate (BFG). Both MPP and BFG are discussed in greater detail below. Such a configuration will yield optimum performance for the CCD including QE, CCE, CTE, and dark current generation. In addition, full well capacity is optimized, pixel nonuniformity is minimized, residual image effects are eliminated and high energy radiation hardness is increased.

Frontside Pinning: MP Operation

Figure 3:
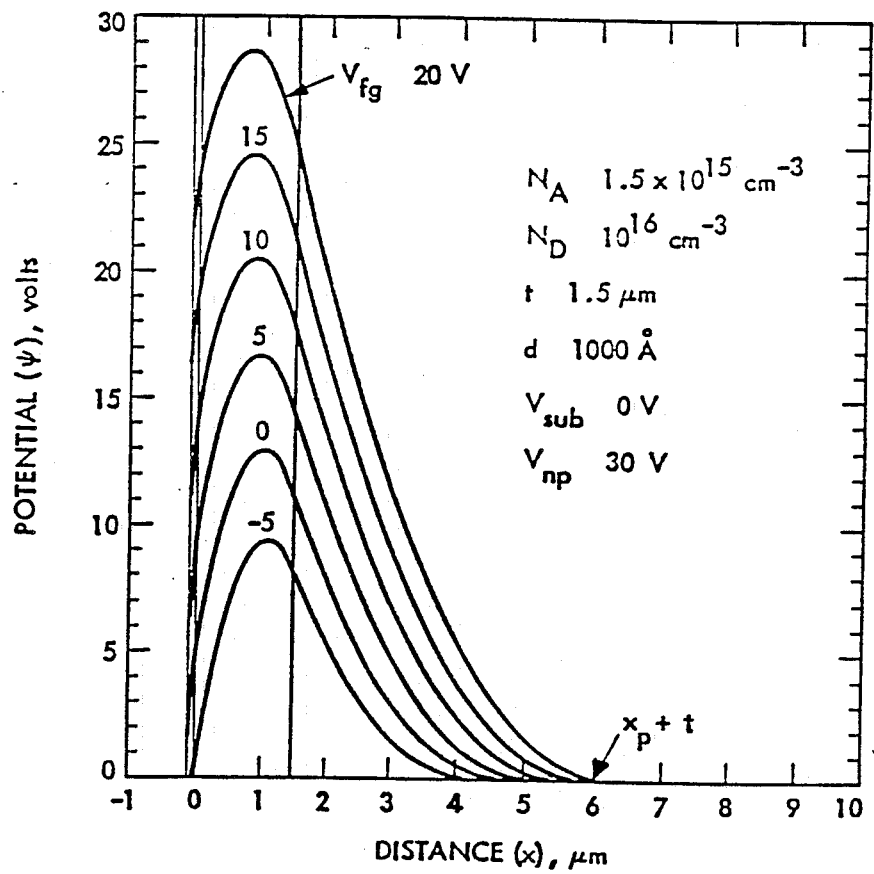
FIG. 3 illustrates plots of potential distribution within a channel as a function of distance for different applied gate voltages to a frontside multiphase CCD.

. Channel inversion is easily promoted in a CCD by biasing the array clocks sufficiently negative to pin the surface potential at the Si—SiO$_2$ interface to substrate potential. FIG. 3 plots the potential distribution within a CCD channel as a function of distance for different applied gate voltages The doping parameters and the thicknesses of the n-channel and oxide shown in the figure best approximate that of a prior-art 800×800 CCD. See M. Blouke, et al., "Current Status of the 800×800 Charge-Coupled Device Image Sensor," Opt. Eng. 26(9), pp. 864–874, September 1987. The figure shows that when the gate voltage is reduced, a corresponding decrease in surface potential at the Si—SiO$_2$ interface results. Lowering the gate voltage to Vfg=−5 V forces the interface to substrate potential, which for this plot is referenced to zero volts. At this point, holes supplied by the channel stops (not shown) are attracted beneath the gate, thus inverting the n-channel. Further reduction of gate bias generates more holes pinning and maintaining a surface potential of zero volts at the Si—SiO$_2$ interface.

Figure 4:
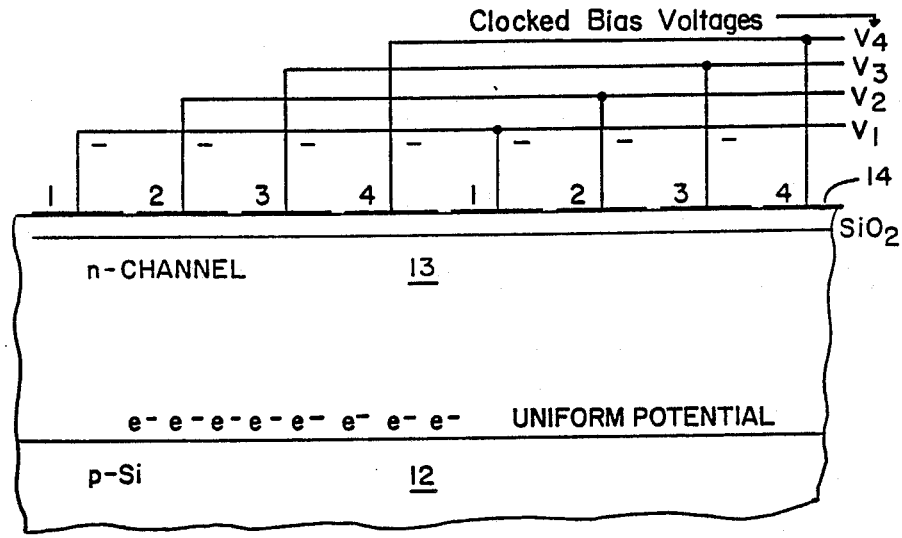
FIG. 4 shows schematically the uniform potential across the multiphase gates of a CCD when all gates are biased at the same negative potential.

Inverting a multiphase CCD, as described above, creates a uniform potential across the CCD gate structure as shown schematically in FIG. 4, which does not provide a potential well for signal charge to collect during the integration phase (i.e., full well capacity is significantly reduced). In order to achieve full inversion in a multiphase CCD and maintain full well capacity, positive ions (p dopant such as boron) is lightly implanted in the n channel under selected gates of the multiphase CCD gate structure creating barrier phases, as illustrated schematically in FIG. 5. Then, in accordance with this multipinned-phase (MPP) technology, multiphase clocks are applied to the gates to create barrier and collection regions having the relative potentials indicated in FIG. 6. Note that in the diagram of FIG. 6, the gates 1 and 3 of every set of four is made much wider than the gates 2 and 4 because it is advantageous to make the collection gates 1 and 3 between the pinned gates 2 and 4 as large as possible Utilization of this multipinned-phase (MPP) inversion technology allows the front Si—SiO$_2$ interface to operate totally inverted during integration and charge transfer while maintaining other CCD performance characteristics. There are many benefits when operating in the MPP mode. One of the main attributes of MPP operation is the reduction of dark current generation. For CCD imagers there are three main sources of dark current. See C. Sequin, et al., Charge Transfer Devices, Academic Press New York, pp. 133–137, 1975. These are (1) thermal generation and diffusion in the neutral bulk, (2) thermal generation in the depletion region and (3) thermal generation due to surface states at the front Si—SiO$_2$ interface. Of these dark current sources, the contribution from surface states is the dominant one for multiphase CCDs. Dark current generation at this interface depends on two factors: (1) the density of interface states (i.e., the quality of the Si—SiO$_2$ interface) and (2) the density of free carriers (holes of electrons) that populate the interface. See A. Grove, Physics and Technology of Semiconductor Devices, John Wiley and Sons, pp. 129–134, 1967. Electrons that thermally "hop" from the valence band to an interface state (sometimes referred to as a midband state) and to the conduction band, produce a dark current electron-hole pair. The presence of free carriers will fill the interface states inhibiting the hopping conduction process and in turn substantially reduce dark current to the bulk level. Conventional CCD operation depletes the signal channel as well as the Si—SiO$_2$ interface of free carriers maximizing dark current generation. Under depleted conditions, the dark current is determined by the quality of the Si—SiO$_2$ interface or the density of the midband states which varies widely among CCD manufacturers.

Figure 5:
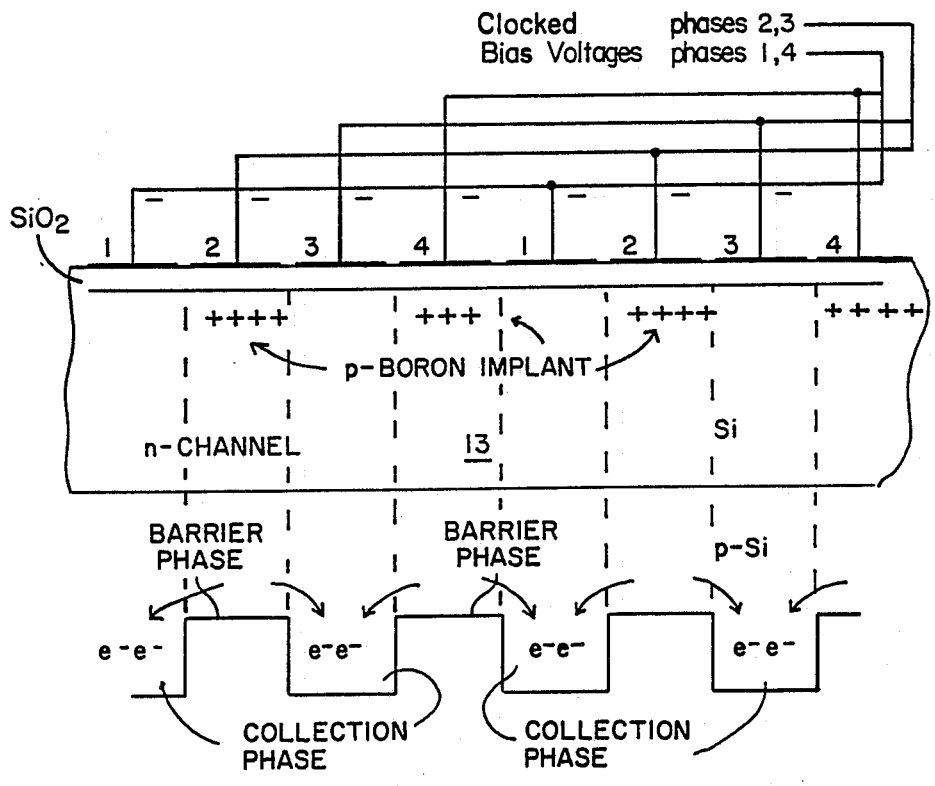
FIG. 5 shows schematically the potential wells established by the multiphase clocks applied to a 4-phase gate structure of a buried n channel CCD incorporating positive ions implanted in the n channel.
Figure 6:
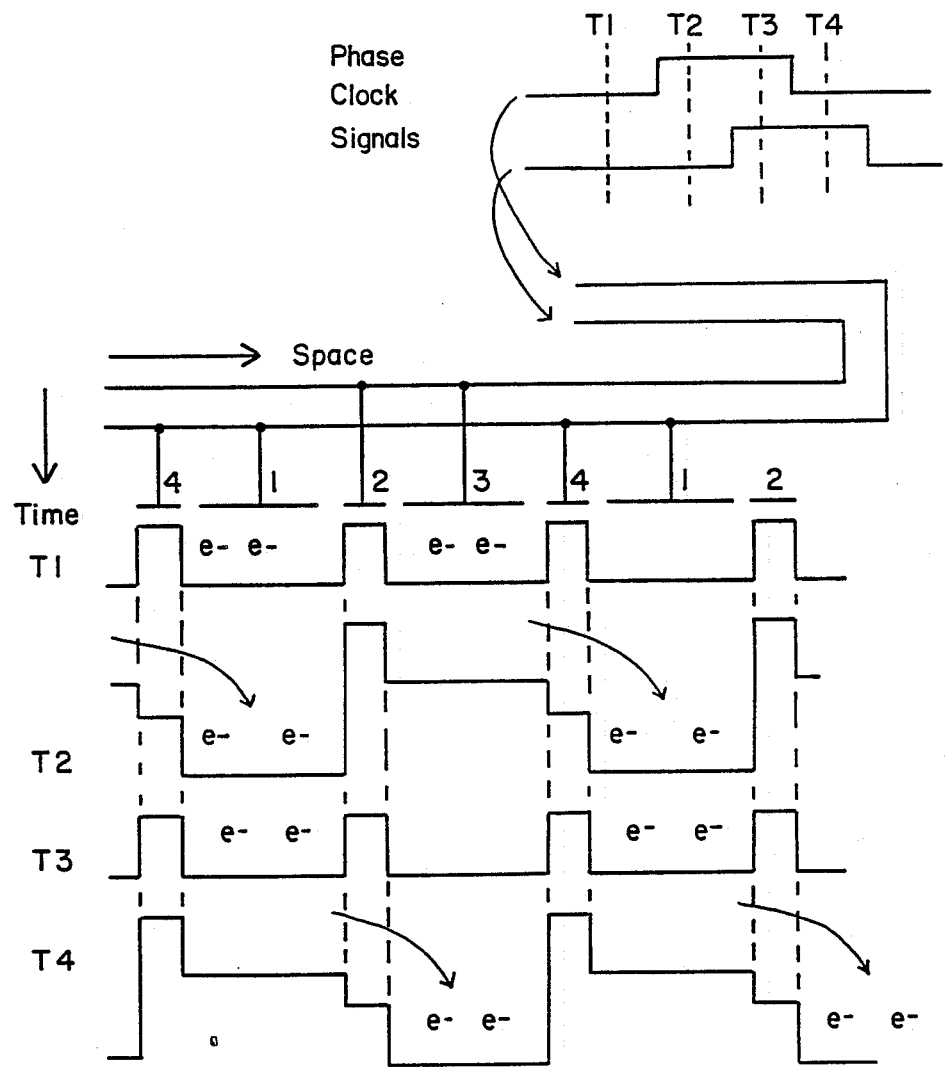
FIG. 6 is a timing diagram showing how charge is transferred in a 4-phase, multipinned CCD.

As noted above, biasing the multiphased clock gates into inversion (hence the name "multipinned phase") causes holes to populate at the interface, thus eliminating surface dark current generation, but unfortunately, when inverting conventional CCDs in this manner, full well collection capacity is destroyed because the potential wells within a pixel all assume the same level. This condition results in severe blooming up and down the signal carrying channel since there is no preferential potential well for charge to collect. MPP technology circumvents this difficulty by employing a p dopant implant beneath one or more gates for phases of a multiphase set for each pixel during the fabrication of the CCD. The extra p dopant creates a potential difference between gates allowing charge to gather in collecting sites while maintaining the inverted condition, i.e., the inversion layer 20 of holes as shown in FIG. 2. Specifically, in the case of the Ford/Photometrics 516×516 CCD (Janesick, et al., SPIE, Aug. 14–19, 1988, cited above), a boron implant was employed beneath phases 2 and 4, as shown in FIG. 5. The resultant doping profile reduced the channel potential beneath these phases allowing charge to collect in phases 1 and 3. The implant dose utilized was sufficient to generate a potential difference of 3 V between phases 1,2 and 3,4 producing a well capacity of 75,000 electrons for the 20-micron pixel. Three-phase MPP-CCDs exhibit well capacities greater than 100,000 electrons assuming an 18-micron pixel where only gates of one of the 3 phases are implanted. Still greater full wells will be realized for future MPP-CCDs by utilizing a greater MPP implant dose.

Figure 7:
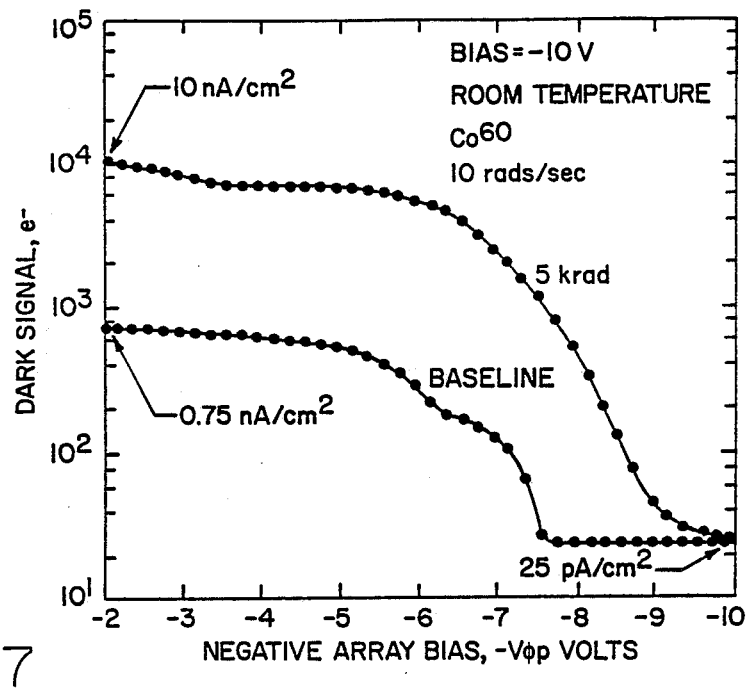
FIG. 7 is a graph of a dark current as a function of negative array clock drive for a 4-phase, multipinned phase CCD biased from the noninverted state into full inversion before and after being radiated with 5 krads of 1.2 Mev gamma rays from a cobalt-60 source.

FIG. 7 presents dark current generation plots as a function of negative array clock drive for a 4-phase Ford 516×516 MPP-CCD. Data is plotted for the CCD sensor biased from the noninverted state into full inversion before and after being radiated with 5 krads of 1.2 Mev gamma rays produced by a cobalt-60 source. Before the CCD was radiated, dark current generation was reduced from 0.75 nA/cm$^2$ to 25 pA/cm$^2$ when inverted, a factor of 30 reduction compared to conventional noninverted clocking. After 5 krads of Co-60 radiation, dark current generation increases by a factor of 13 in the noninverted state due to an increase in the number of interface states. In the present MPP mode, dark current generation remains unchanged since the newly formed interface states created by the gamma rays are passivated with holes induced by the present MPP process. Thus, dark current in the inverted state is 400 times lower than in the noninverted state after the radiation dose. In the MPP mode, dark current is limited by dark current generation from the bulk silicon.

Figure 8:
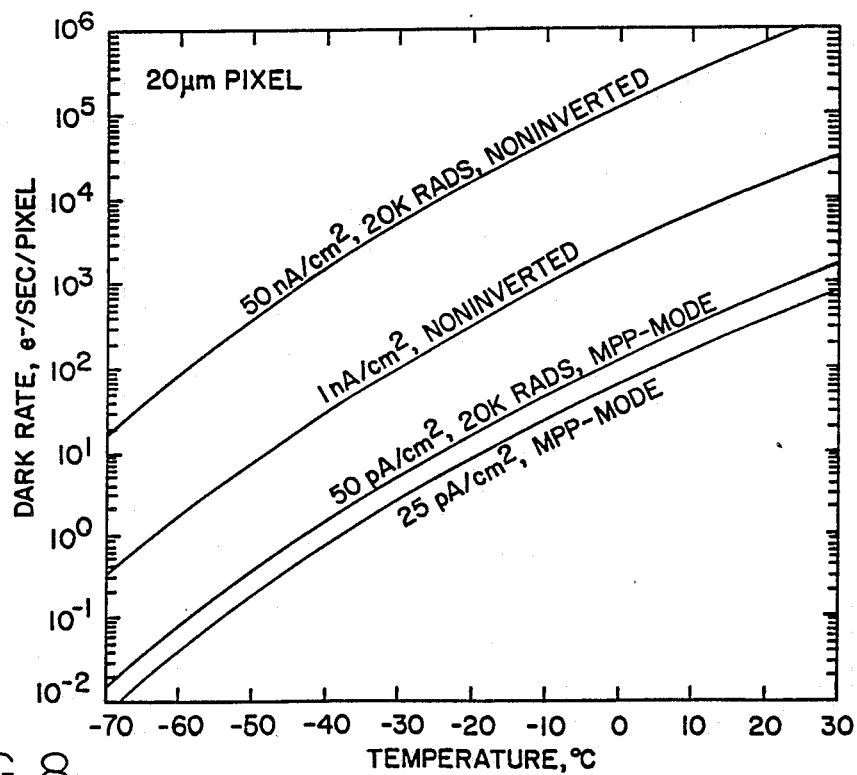
FIG. 8 is a graph of dark current generation as a function of negative array clock drive for a 4-phase, multipinned CCD.

FIG. 8 plots dark current as a function of operating temperature for the same sensor as in FIG. 7. The graphs show the dark levels measured under inverted and noninverted conditions before and after the sensor was exposed to 20 krads of cobalt-60 gamma rays. The difference in dark rate generation after the radiation dose is over 3 orders of magnitude higher between the two operating modes demonstrating the power of MPP operation in a radiation environment. The finite dark current increases for the MPP mode by a factor of two due to radiation damage of the bulk silicon.

MPP technology has been demonstrated to be beneficial in other areas of performance for the CCD. For example, surface residual image problems completely vanish. Residual image occurs when the CCD is overexposed beyond full well capacity causing signal electrons to get trapped at the front Si—SiO$_2$ interface. Under cold operation trapped charge slowly releases during the course of a long integration period resulting in a "surface residual image." By inverting the Si—SiO$_2$ interface, holes recombine with the trapped electrons eliminating residual charge. Residual image in CCDs is discussed further in Janesick, et al., SPIE, Jan. 16–18, 1989 (cited above) and Janesick, et al., "Scientific Charge-Coupled Devices," Optical Engineering 26(8), pp. 692–714, August 1987.

Partial Inversion

The benefits of channel inversion discussed above can, in part, be implemented in conventional CCDs by a clocking technique referred to as a "partial-inversion technique." For example, two of the phases of a 3-phase CCD can be maintained inverted while the third operates noninverted to collect signal charge. Although dark current generation in this partial-inversion mode of operation is not as low as a full MPP operation, dark current is cut by at least ⅔. Also residual image is significantly curtailed. Partial-inversion will also allow the CCD to be optimally biased to deliver the highest full well capacity possible, as well as controlling blooming characteristics. See J. Janesick, et al., "Recent Developments of Large Area Scientific CCD Image Sensors,"

SPIE Optical Sensors and Electronic Photography, Vol. 1071, Los Angeles, Calif. Jan. 16-18, 1989. In addition, partial inversion will minimize pixel nonuniformity in CCDs. See J. Janesick, et al., "Scientific Charge-Coupled Devices," Optical Engineering 26(8) PP. 692-714, August 1987. Although dark current generation in this mode of operation is not as low as MPP operation, dark current is cut by at least ⅔. Also residual image is significantly curtailed. Partial inversion will also allow the CCD to be optimally biased to deliver the highest full well capacity possible, as well as controlling blooming characteristics. In addition, partial inversion will minimize pixel nonuniformity in CCDs. See Janesick, et al., Optical Engineering, August, 1987, cited above.

Backside Pinning: Biased Flash Gate

To avoid the idiosyncrasies of backside charging and the flash gate, an improved accumulation technique has been developed, namely the biased flash gate (BFG) as described below.

As mentioned above, when the flash gate is subjected to high vacuum (or a dry inert gas), QE-pinning is not reliably maintained. The reason for this behavior has been traced to the oxide on which the gate resides. It is believed that oxygen and water vapor found in ambient environments play an important role in the structure of the oxide layer by participating in tying bonds at the Si—SiO$_2$ interface. Under high vacuum conditions, these constituents are removed upsetting the bonding equilibrium at the interface resulting in more dangling bonds and positively charged interface states. For instance, it has been shown that QE slowly degrades when back-illuminated CCDs are subjected to a vacuum environment implying that the net positive oxide charge increases creating a larger backside well. An increase in surface state density due to a vacuum environment or dry inert gas effectively lowers the work function difference between the flash gate and the CCD reducing the strength of the accumulation layer. Janesick, et al., Optical Engineering (Sept. 1987) cited above. If the flat-band shift experienced by the oxide layer is excessively large, the benefits of the flash system will be completely lost and promote depletion as opposed to accumulation resulting in very poor quantum efficiency.

The biased flash gate was invented to compensate for the flat-band shift that occurs under vacuum conditions. It is similar in structure to the flash gate shown in the prior art (FIG. 1) except that the metal gate is thicker, and it is biased negatively by at least −0.04 volts as shown in FIG. 2.

Figure 9A:
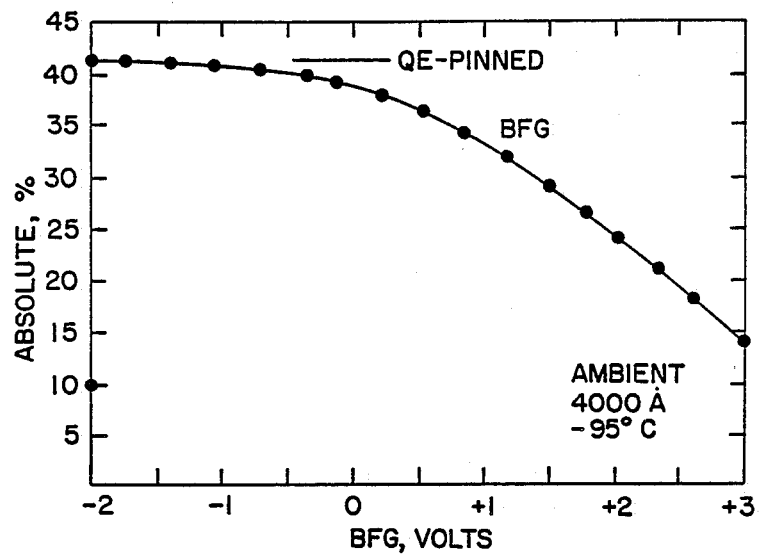
FIG. 9a illustrates a transfer characteristic curve of a platinum biased flash gate CCD showing QE at 4000 Å as a function of gate bias from data generated while the CCD package was open to ambient conditions before being cooled to 95° C., and shows that at zero-bias the work function of the platinum is sufficient to nearly QE-pin the device.
Figure 9B:
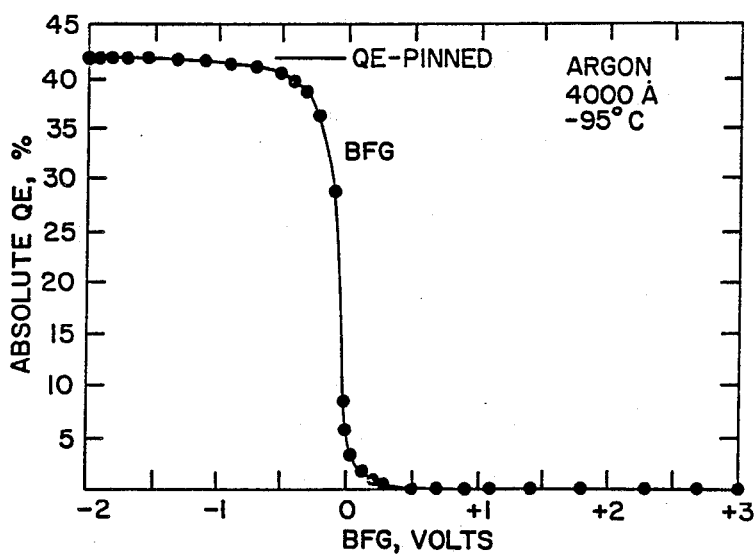
FIG. 9b illustrates a transfer characteristic curve for the same biased flash gate CCD measured in FIG. 9a after the CCD was packaged in an inert argon environment and cooled to −95° C., which shows a significant flat-band shift due to the argon gas reducing the QE from 40% to less than 5% at zero-bias.

Transfer characteristics of a biased flash gate three-phase CCD (800×800) manufactured at Jet Propulsion Laboratory are presented in FIGS. 9a and 9b which plot QE at 4000 Å as a function of BFG bias. FIG. 9a shows the response when the sensor is housed under ambient conditions before being cooled to an operating temperature of −95° C. In FIG. 9a, the QE at zero bias indicates that the work function of the platinum is sufficient to nearly QE pin the device. FIG. 9b shows its QE after being hermetically sealed in a package containing pure argon. A significant flat-band shift is experienced due to the argon gas reducing the QE from 40% to less than 5% at zero bias. Both graphs show that QE decreases when the BFG is positively biased, thereby inducing the formation of a backside well. Conversely, when the BFG is negatively biased an accumulation layer develops driving signal electrons away from the back surface and increasing QE.

Figure 10:
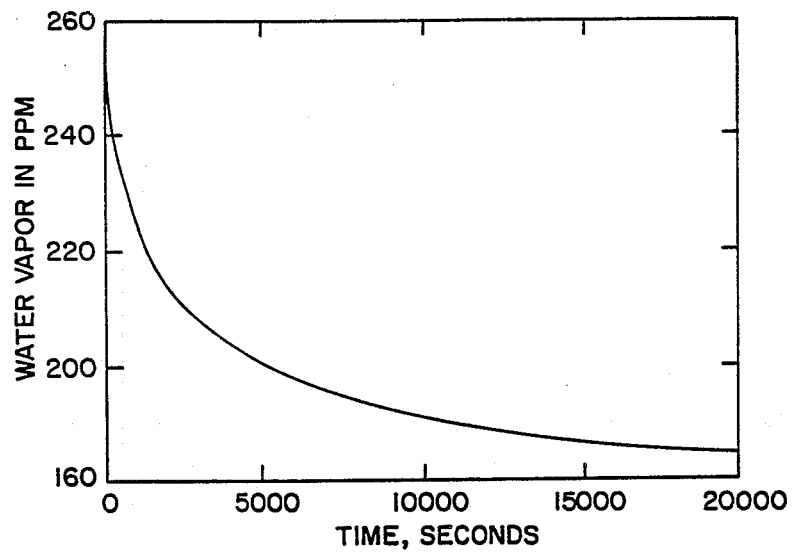
FIG. 10 is a plot of water vapor concentration measured in a CCD package while it was baked for 24 hours at 100° C. under a vacuum of 10$^{-7}$ torr and then "pinched off" to a pure argon environment.

The effects of the argon environment are clearly apparent in FIG. 9b. Before the CCD is exposed to argon, the CCD is nearly QE-pinned at zero bias indicating that the high work function of the platinum flash gate alone is sufficient to accumulate the CCD. However, when the CCD is subjected to a pure argon environment, a large flat-band shift develops presumably because the gate oxide "dries out" increasing the net positive interface charge. To give some credibility to this theory, FIG. 10 plots water content inside the CCD package (parts per million) after it was baked for 24 hours at 100° C. under a vacuum of $10^{-7}$ torr and then "pinched off" to a pure argon environment. As the water concentration slowly disappears due to some unknown "pumping" process within the package, a decrease in QE also occurs. The degradation in QE is believed related to a structure change in the oxide layer, specifically an increase in interface state density caused by the release of an atomic species, such as hydrogen, at the Si—SiO$_2$ interface.

As seen in FIG. 9b, at zero bias the QE drops from 40% to less than 5% indicating that the back surface of the sensor moves from accumulation to depletion in the argon environment. Biasing the flash gate negatively by −1 V compensates for the newly formed positive interface states re-establishing QE to the original QE-pinned level as demonstrated in FIG. 9b.

It should be mentioned that the BFG bias does not contribute to the overall global dark current floor of the CCD. However, if the BFG bias is too excessive, isolated pixels exhibit leakage currents, presumably due to oxide breakdown. When the first BFG-CCD was fabricated, it was believed that it was similar in structure to a Schottky barrier or a tunneling MOS device. For Schottky barrier devices, the metal gate and silicon make intimate contact and lack an insulator layer. A tunneling MOS system relies on a very thin oxide, sufficiently thin to allow currents to pass through the oxide layer quantum mechanically. When biased, both the Schottky and tunneling devices exhibit relatively large currents. Dark current measurements of the BFG-CCD show that the leakage currents are well below the levels typically measured for CCDs (less than 0.001 electrons/sec/pixel at −100° C.). These tests indicate that the BFG bias is a simple MOS structure where the oxide layer is thick enough to act as a barrier to all conduction currents.

Electronic Shuttering

Figure 11:
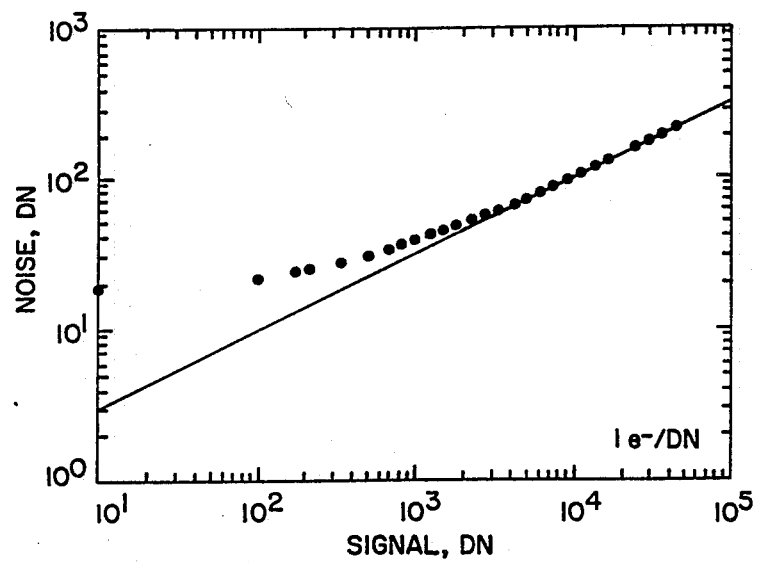
FIG. 11 illustrates a photon transfer curve generated using the BFG as an electronic shutter stimulated with 4000 Å light to show that a gate voltage of +1 V annihilates the sensor's QE forming a large backside well, and that a gate voltage of −1.0 V accumulates the back of the CCD into the QE-pinned state.
Figure 12A:
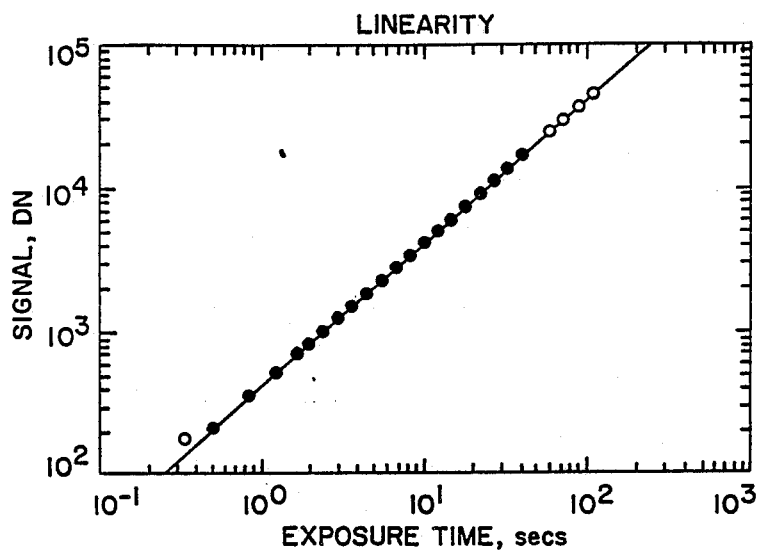
FIGS. 12a and 12b are linearity plots and linearity residuals, respectively, produced using the BFG as an electronic shutter to show that linearity is well-behaved indicating that the built-in shutter is linear over the exposure times used.
Figure 12B:
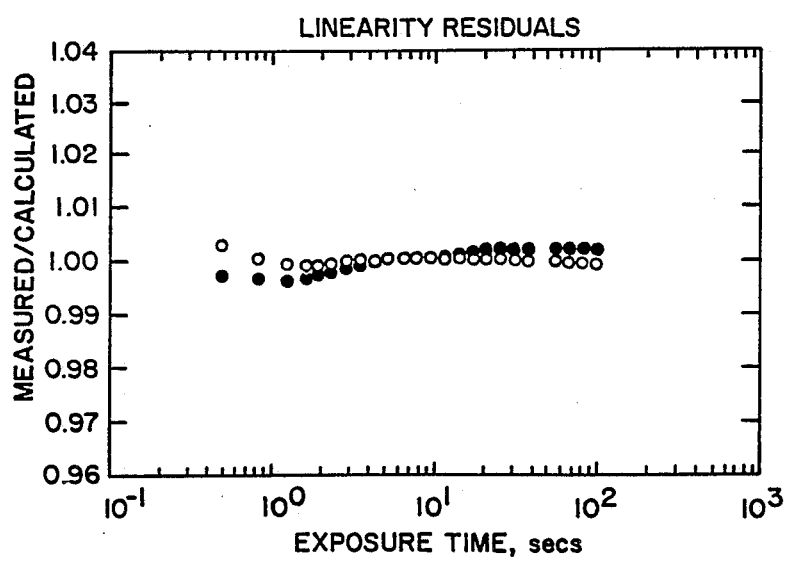

As the bias is varied from depletion ($V_{BFG}=+0.2$ V) to the accumulation state ($V_{BFG}=-0.2$ V), the QE initially rises at the BFG contact as the bias is made more negative. A bias of slightly more than −0.2 V will QE-pin the entire CCD, yielding a uniform response. Therefore −0.4 V is regarded as sufficient. FIG. 9b thus shows that QE of the CCD can be directly controlled by the BFG bias. In fact, it shows that the QE at 4000 Å can be varied from 43% to 0.002% by simply adjusting the BFG bias from −1 V to +1 V, a change in QE of 21,500. Therefore, as an additional advantage, the BFG bias allows for electronic shuttering. To show this capability, the photon transfer curve shown in FIG. 11 and the linearity plots presented in FIGS. 12a and 12b were generated by continuously exposing the CCD to light and using the BFG bias as a shutter. The plots demonstrate that the linearity of the BFG as a shutter is exceptionally well behaved for exposure periods down to 1 second, maintaining linearity to within 1% over the dynamic range of the CCD. Additional measurements for the same sensor indicate that the BFG can deliver good linearity to 1 milli-sec. Such measurements suggest that a thicker BFG could be fabricated to achieve ultra-fast shutter times, possibly in the micro-sec range. However, a penalty would be paid in QE since a transmission loss through the gate would arise. A flash gated CCD typically utilizes 3 to 5 Å of platinum. The biased flash gate employs more than 20 Å of platinum to assure that the gate is electrically conductive over the entire thinned membrane of the CCD.

I claim:

1. In a back-illuminated, buried-channel, multiphase charge-coupled device for imaging, said device having a buried n channel in a p layer and an insulating oxide layer between said buried channel and multiphase gates employed for control of integration and transfer of photogenerated charges, inversion means for reducing dark current generated at a front interface between said channel and said oxide layer due to surface states at said front interface by populating said front interface with free carrier holes, wherein said inversion means is implemented with a negative bias potential selectively applied by clocking to said multiphase gates during integration and transfer of charges, thereby pinning the surface potential of said front interface to a potential for inversion and positive ions implanted in said n channel at selected multiphase gates to create barrier phases within each pixel while multiphase clocks are applied to gates other than the selected gates for integration and transfer of photogenerated charges.

2. A device as defined in claim 1 having an overthinned substrate area on the backside opposite said buried channel, an oxide film on said overthinned area and a metal flash gate, accumulation means for reducing dark current generated at a backside interface between said overthinned substrate and said flash oxide film due to surface states at said backside interface by populating said backside interface with free carrier holes.

3. A device as defined in claim 2 wherein said accumulation is comprised of a negative bias potential applied to said metal flash gate to provide for quantum efficiency response of said device.

4. A device as defined in claim 3 wherein said negative bias potential applied to said back flash gate is variable from an accumulation state toward a depletion state, thereby to vary the quantum efficiency of said device to vary the signal charge accumulated as a function of time for electronic shuttering of said device.

5. A device as defined in claim 4 wherein said negative bias potential applied to said back flash gate is variable between $-1$ V and $+1$ V.

6. A device as defined in claim 3 wherein said negative bias potential selectively applied is about $-6$ V.

7. A device as defined in claim 6 wherein said negative bias potential applied to said metal flash gate is about $-0.4$ V.

* * * * *

(12) REEXAMINATION CERTIFICATE (4402nd)
United States Patent
Janesick

(10) Number: US 4,963,952 C1
(45) Certificate Issued: Jul. 31, 2001

(54) MULTIPINNED PHASE CHARGE-COUPLED DEVICE

(75) Inventor: James R. Janesick, La Canada, CA (US)

(73) Assignee: California Institute of Technology, Pasadena, CA (US)

Reexamination Request:
No. 90/004,890, Jan. 9, 1998

Reexamination Certificate for:
Patent No.: 4,963,952
Issued: Oct. 16, 1990
Appl. No.: 07/321,739
Filed: Mar. 10, 1989

(51) Int. Cl.[7] .................. H01L 27/148; H01L 29/768; G11C 19/28
(52) U.S. Cl. .................. 257/223; 257/221; 257/228; 257/248; 377/58
(58) Field of Search .................. 257/222, 223, 257/221, 228, 248; 377/58

(56) References Cited

U.S. PATENT DOCUMENTS

| | | | | |
|---|---|---|---|---|
| 3,931,465 | * | 1/1976 | Levine | 257/230 |
| 4,328,432 | * | 5/1982 | Yamazaki | 257/230 |
| 4,489,423 | * | 12/1984 | Suzuki | 257/223 |
| 4,593,303 | * | 6/1986 | Dyck et al. | 257/223 |
| 4,663,771 | * | 5/1987 | Takeshita et al. | 257/229 |
| 4,742,381 | * | 5/1988 | Fujii | 257/230 |
| 4,760,031 | * | 7/1988 | Janesick | 257/228 |
| 4,798,958 | * | 1/1989 | Janesick et al. | 257/228 |
| 4,822,748 | * | 4/1989 | Janesick et al. | 257/222 |

OTHER PUBLICATIONS

Janesick et al, "Radiation Damage in Scientific Charge-Coupled Devices", IEEE Trans. Nuclear Science, vol. 36 (Feb. 1989) pp. 572–578, which is Proceedings Nuclear Science Symposium, Orlando, Nov. 9–11, 1988.*

Janesick et al, "Fano–Noise–Limited CCDS", Proceedings SPIE vol. 982, X-Ray Instrumentation in Astronomy, pp. 70–94, San Diego, Aug. 15–17 1988.*

Janesick et al, "Recent Developments in Large Area Scientific Image Sensors", SPIE Optical Sensor and Electronics Conf., Los Angeles, Jan. 16–18, 1989.*

(List continued on next page.)

Primary Examiner—Gene M. Munson

(57) ABSTRACT

A back illuminated, buried channel, multiphase charge-coupled device for imaging has a photosensitive volume bounded by silicon dioxide layers on both the front and back. The dark noise generated by these interfaces with the photosensitive volume is reduced by negative bias potential pinning the front at about −6V and the back at about −0.4V. To create fixed barrier phases at the front for accumulation within each pixel comprised of multiphase gates, positive ions are implanted at one phase gate while the others are phase clocked into channel inversion. Otherwise the phase clock of at least one gate must be controlled to provide accumulation to provide a "partial-inversion" technique. The negative bias at the back may be varied to adjust the quantum efficiency of the device, thus providing electronic shuttering.

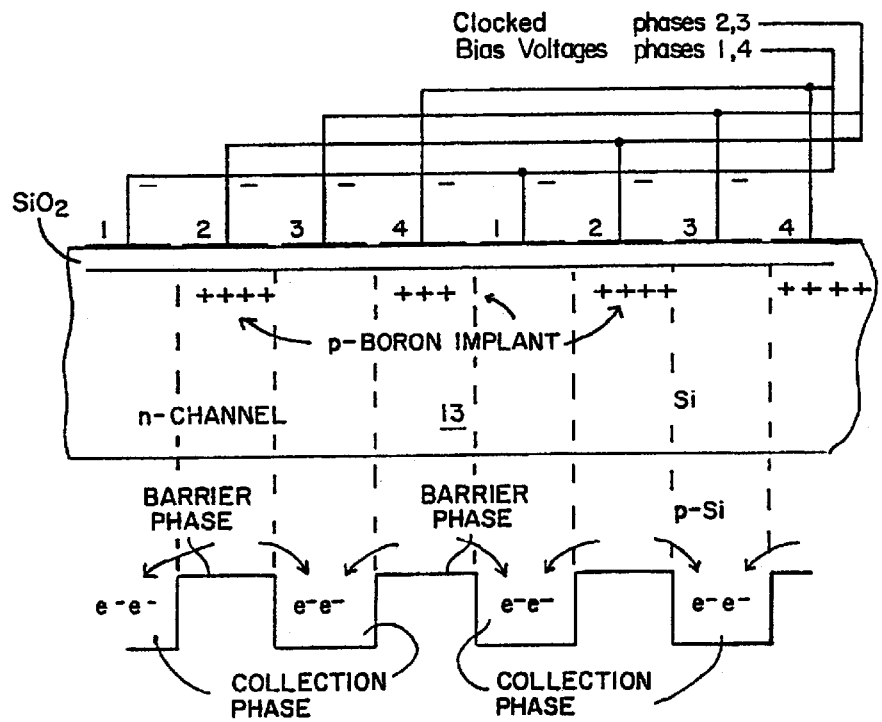

OTHER PUBLICATIONS

Janesick et al, "Backside Charging of the CCD", Solid State Imaging Arrays, K. Pretty Johns and E. Dereniak, Eds. Proceedings SPIE 570, pp. 46–80, 1985.*

Janesick et al, "The CCD Flash Gate", Instrumentation in Astronomy VI, D. Crawford, Ed. Proceedings SPIE 627, pp. 543–582, 1986.*

Janesick et al, "Charge–Coupled Device Charge Collection Efficiency and the Photon Transfer Technique", Opt. Eng. 26(10), pp. 972–980, Oct. 1987.*

Janesick et al, "Charge–Coupled Device Advances for X–Ray Scientific Applications in 1986", Opt. Eng. 26(2) pp. 156–166, Feb. 1987.*

Janesick et al, "Scientific Charge–Coupled Devices", Opt. Eng. 26(8), pp. 692–714, Aug. 1987.*

Walden et al "The Buried Channel Charge Coupled Device", Bell System Technical Journal, vol. 51, pp. 1635–1640, 1972.*

Blouke et al, "Current Status of the 800×800 Charge–Coupled–Device Image Sensor", Opt. Eng. 26(9), pp. 864–874, Sep. 1987.*

Saks, N.S. A Technique for Suppressing Dark Current Generated by Interface States in Buried Channel CCD Imagers, IEEE Electron Device Letters, vol. EDL–1, No. 7, Jul. 1980, p. 131.

Saks, N.S. A New Technique for Hardening CCD Imagers by Suppression of Interface State Generation, IEEE Transactions on Nuclear Science, vol. NS–27, No. 6, Dec. 1980, p. 1727.

* cited by examiner

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 1 is confirmed.

Claim 2 is cancelled.

Claim 3 is determined to be patentable as amended.

Claims 4–7, dependent on an amended claim, are determined to be patentable.

3. A device as defined in claim [2] *1 having an overthinned substrate area on the backside opposite said buried channel, an oxide film on said overthinned area, a metal flash gate, and accumulation means for reducing dark current generated at a backside interface between said overthinned substrate and said flash oxide film due to surface states at said backside interface by populating said backside interface with free carrier holes,* wherein said accumulation *means* is comprised of a negative bias potential applied to said metal flash gate to provide for quantum efficiency response of said device.

* * * * *